United States Patent [19]

May

[11] Patent Number: 4,544,577

[45] Date of Patent: Oct. 1, 1985

[54] PROCESS FOR METALLIZATION OF DIELECTRIC SUBSTRATE THROUGH HOLES

[75] Inventor: Ruth A. May, Owatonna, Minn.

[73] Assignee: E. F. Johnson Company, Waseca, Minn.

[21] Appl. No.: 604,076

[22] Filed: Apr. 26, 1984

[51] Int. Cl.⁴ .............................................. B05D 5/12
[52] U.S. Cl. ..................................... 427/97; 427/53.1; 427/205; 427/229; 427/230; 427/238
[58] Field of Search ................ 427/97, 53.1, 229, 230, 427/238, 202, 204, 205

[56] References Cited

U.S. PATENT DOCUMENTS

| | | |
|---|---|---|
| 2,798,577 | 7/1957 | LaForge .............................. 427/205 |
| 3,357,856 | 12/1967 | Ragan et al. . |
| 4,020,206 | 4/1977 | Bell ....................................... 427/97 |
| 4,024,629 | 5/1977 | Lemoine et al. ....................... 427/97 |
| 4,047,290 | 9/1977 | Weitze et al. .......................... 427/97 |
| 4,131,516 | 12/1978 | Bakos et al. ........................... 427/97 |
| 4,170,819 | 10/1979 | Peter et al. ............................ 427/97 |
| 4,301,192 | 11/1981 | Plichta .................................. 427/97 |

Primary Examiner—John H. Newsome
Attorney, Agent, or Firm—Dorsey & Whitney

[57] ABSTRACT

A method of metallizing through holes in dielectric substrates with a metallizing material comprising forming a hole in the substrate utilizing laser techniques, depositing a layer of a dielectric on the side wall of the hole and then depositing a layer of a metallizing material onto the dielectric layer.

16 Claims, 4 Drawing Figures

PROCESS FOR METALLIZATION OF DIELECTRIC SUBSTRATE THROUGH HOLES

TECHNICAL FIELD

The present invention relates generally to an improved method for metallizing through holes in printed circuit dielectric substrates. In particular, it relates to a method for providing copper metallization of laser bores through holes in alumina substrates.

BACKGROUND ART

Dielectric boards are used as substrates for printed circuits are commonly provided with through holes for making connections from the circuit on one side of the board to a circuit on the opposed side of the board. The through holes must be "metalized" in order to provide conductive paths between the two sides of the board; that is to say, a film of an electrically conductive material must be deposited on the sidewalls of the through holes. Processes for accomplishing the metallization of substrate through holes have attracted much attention from electronics manufacturers, as evidenced by patented processes such as those disclosed in U.S. Pat. Nos. 4,301,192, 4,024,629, 4,020,206, 4,170,819 and 3,357,856.

While many dielectric substances have been used to form printed circuit board substrates, alumina ($Al_2O_3$) has been found to be an excellent substrate material in many electronic applications. In particular, alumina has a higher dielectric constant, higher mechanical strength, and can be subjected to higher processing temperatures than other commonly used substrates. Alumina's high dielectric constant (9.5 to 10) provides for improved high frequency stability and allows for the reduction of overall circuit size.

Alumina substrates are manufactured by forming $Al_2O_3$ or alumina crystals into generally flat tape. The "green" tape is then cut into common useable shapes and fired at a temperature of about 1400° C. into the final substrate. The fired alumina is an extremely hard, brittle material.

Attempts to bore through holes in hardened alumina with conventional drilling techniques have been unsuccessful. This is due to the fact that alumina is one of the hardest known substances and is therefore resistant to such conventional drilling. Only diamond drill bits will successfully penetrate the alumina. Conventional drilling techniques have also been unsuccessful because the alumina is brittle and subject to shattering during the drilling process. Although through holes can be drilled in the green alumina substrate prior to firing, the alumina is subject to nonuniform shrinkage during the firing process. It is therefore impossible to locate the through holes with the precision desired.

The above described problems of providing alumina substrate, or any other substrate having similar properties, with through holes can be circumvented by the use of lasers to bore the through holes in the fired substrate. Laser bored through holes can be be made with a diameter as small as 2/1000 of an inch and can be located within plus or minus 1/1000 of an inch of a preselected position. When using alumina substrate, however, the laser boring process leaves a high alumina/low silica magnesia glassy slag along the periphery of the through holes. This glassy slag is a result of a small amount of silica/magnesia which is present in varying amounts in virtually all dielectric substrates, including the alumina substrates of the preferred embodiment. The volume of slag is greatest at the bottom of the hole, and negligible at the top, due to the explosive nature of the laser process. The presence of the smooth, glassy slag along the through holes sidewalls has little significance when certain metallizing materials, such as silver or palladium silver are used for the metallization of the through hole. The presence of the glassy slag, however, for reasons explained below, does present significant problems when it is desired to use copper pastes as the metallizing material. Copper is a desirable conductor in many circuits because of its high conductivity, low cost, and relatively high Q factor.

A preferred method for metallization of printed circuit board through holes including laser bored through holes, is accomplished by depositing a thixotropic metallizing liquid around the periphery of each through hole opening, and then placing a vacuum directly beneath the opening to draw the metallizing liquid downwardly over the sidewalls of the through hole. A continuous film of the metallizing liquid is thereby uniformly distributed over the sidewalls. The liquid coating is then treated, usually by firing at high temperatures, to form a continuous, solidified, electrically connecting path between the opposed faces of the circuit board substrate. The term "metallizing liquid" refers to molten metal, metal solutions, dispersions, suspensions, or any other metal containing substance which can be made to flow over a solid surface, and then be treated to form a solidified, conducting, metallized path.

Attempts to apply copper paste directly to the sidewalls of laser bored through holes in alumina substrate have been unsuccessful because of the mechanical smoothness and chemical mismatch of the slag produced by the laser boring process with copper pastes. Copper particles, suspended in a metallizing fluid such as copper paste, act as if they were platelettes aligning themselves during the firing process. The alignment process, therefore, shrinks the bulk volume of the fired copper. Copper adhesion relies on a chemical bond of matching crystal structures. This bond is a strong mechanical process. When copper pastes are used in the metallization of laser bored through holes in alumina substrate, the smooth slag remaining on the through hole sidewalls hinders the matching of crystal structures and allows shrinkage of the copper volume during the firing process. The end result is the failure of the copper to bond to the through hole sidewall. The copper is therefore bonded to the substrate only at the opposed faces of the substrate, and the through hole connection is easily broken.

One solution to the above described bonding problem is to make the diameter of the through holes no larger than 3/1000 of an inch. When copper pastes are fired in a hole 3/1000 of an inch or less, the copper actually forms a solid wire, and the stresses at the edges of the hole are reduced. Subsequent thermal cycling of the copper "wire", however, such as soldering, causes enough thermal expansion to break the wire at the edge of the hole.

Accordingly, there is a need for a process providing for the metallization of the laser bored through holes in circuit board substrates such as alumina or the like and in particular a need for a process involving the copper metallization of laser bored through holes in alumina substrates.

SUMMARY OF THE INVENTION

The problems outlined above are in large measure solved by the process of the present invention which permits the reliable metallization of laser bored through holes in dielectric substrates. More particularly, the process of the present invention involves forming a through hole in a dielectric substrate using laser techniques, preparing the through hole sidewall surface for metallization by depositing a dielectric material over the glassy slag byproduct of the laser boring process, and then depositing a layer of the metallizing conductive material over the dielectric material. The dielectric material bonds well to both the glassy slag as well as the metallizing material to secure the same to the substrate. When using a substrate of alumina, the preferred dielectric material comprises an alumina filled glass material.

Accordingly, it is an object of the present invention to provide a method of metallizing a laser bored through hole in a printed circuit board substrate.

Another object of the present invention is to provide a method for the copper metallization of a laser bored through hole in an alumina substrate.

These and other objects will become apparent with reference to the drawings, the description of the preferred method and the appended claims.

DESCRIPTION OF THE PREFERRED METHOD

Figure 1:
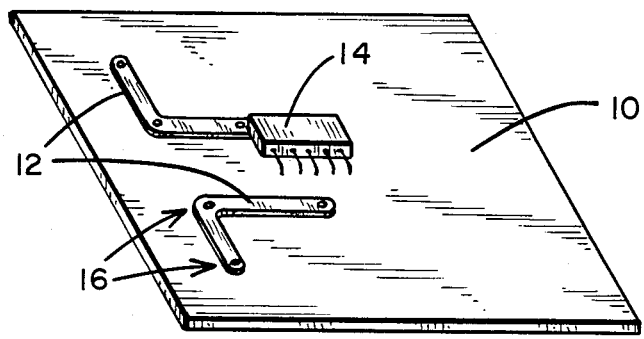
FIG. 1 is a pictorial view of a printed circuit board having a plurality of through holes therein.

FIG. 1 illustrates a printed circuit board substrate 10 having printed circuitry 12 and electrical components 14 thereon. The substrate 10 also includes a plurality of through holes 16, extending between the opposed faces of the substrate 10.

Although the method of the present invention has applicability to substrates constructed from various materials, it has particular applicability to substrates constructed from materials such as alumina which are relatively hard and brittle. Because of these properties, through holes in such substrates cannot be bored using conventional techniques. However, good results have been obtained using lasers to bore holes in the hard and brittle substrates. In particular, the through holes are advantageously bored with pulses of a high intensity $CO_2$ laser. The laser beam explosively evaporates the portion of the substrate where the beam is concentrated to thereby form a through hole in the substrate. however, in addition to boring the hole, the laser boring process leaves a smooth, glassy slag along the sidewalls of the through hole. When the substrate is alumina, the glassy slag has a relatively high alumina and relatively low silica magnesia content. The slag also includes a low concentration of alumina crystals embedded therein.

Figure 2:
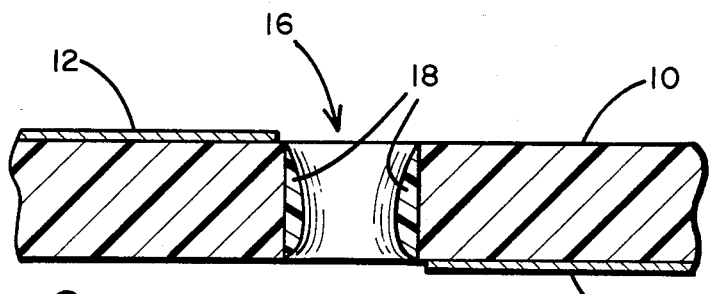
FIG. 2 is an enlarged, fragmentary, sectional view of a printed circuit board substrate with a laser bored through hole therein.

A laser bored through hole is illustrated in FIG. 2 in which the substrate is identified by the reference numeral 10, the through hole by the reference numeral 16 and the glassy slag by the refrence numeral 18. During the laser boring process, the concentrated pulses of high energy cause the material in the area of greatest concentration to evaporate and the material around the hole to liquify. When the laser pulsing is stopped, the liquid freezes to form the above-mentioned glassy slag. As shown, the amount of slag 18 is greatest at the bottom of the hole and almost non-existent at the top. This is due to the explosive nature of the laser process; the material at the top is literally blown out while the molten material at the bottom of the hole remains and flows.

As discussed above, certain metallizing materials do not adhere well to the smooth, glassy surface of the slag 18. In particular, copper based metallizing material such as metallizing copper pastes do not adhere well. It is believed that this is due to the fact that the copper adhesion is more mechanical in nature than chemical and that the smooth, glassy surface of the slag 18 prevents good mechanical adhesion. Poor adhesion is also due, in part, to the fact that the thermal expansion coefficient of the slag is significantly different than that of the metallizing material such as copper paste.

Figure 3:
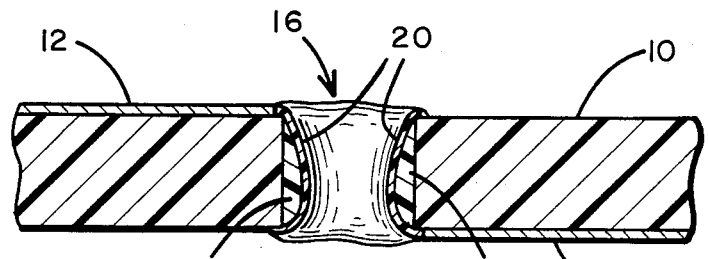
FIG. 3 is a sectional view similar to FIG. 2 but with a dielectric material deposited on the sidewalls of the through hole in accordance with the present invention.
Figure 4:
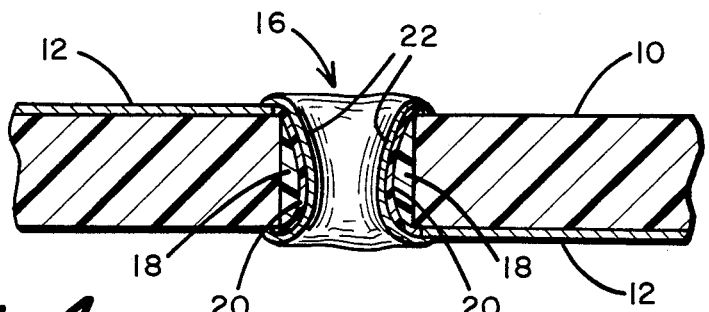
FIG. 4 is a sectional view similar to FIG. 3 but with a conducting metal deposited on the dielectric material within the through hole in accordance with the present invention.

In accordance with the present invention, an intermediate material is deposited on the sidewalls of the laser bored through hole to act as an adhesive bridge between the glassy slag 18 and the metallizing material. This intermediate, adhesive bridge material is illustrated in FIG. 3 as reference numeral 20. Although various materials can be used for this purpose, such materials should preferably include several characteristics. First, the material should be reasonably compatible, both chemically and thermally, with the slag 18 as well as the metallizing material. Most dielectric substrates, such as the preferred alumina substrate 10 include a small amount of glass. Similarly, many of the metallizing materials such as the conventional copper pastes include frit or glass particles embedded therein. The preferred intermediate material is a glass filled alumina dielectric in which the glass therein is chemically reactive to the glass in both the slag 18 and the metallizing material. This permits the formation of a crystalline structure which bonds both the slag 18 and the metallizing material. Secondly, the intermediate material 20 must be able to withstand the firing temperature of the metallizing materials and not diffuse into the metallizing material during firing so as to adversely affect its resistivity. Thirdly, the intermediate material must have a thermal coefficient which is compatible with the substrate.

In the preferred method, the intermediate material 20 is a glass filled alumina dielectric of the type commonly used in multi-layer printed circuits or in crossover applications. A preferred dielectric is Du Pont 4575 D dielectric. However, other dielectrics including Electro Materials Corp. of America (EMCA) 6030-1 and Cermalloy 7116 have also been shown to be satisfactory.

The sidewalls of the through holes must be metallized with an electrically conductive metal film in order to provide electrically conducting paths extending between the opposed faces of the substrate 10. The copper pastes are directly applied to a screen that is in turn directly placed over the alumina substrate. The screen has openings where the circuit pattern and through holes are located. A squeegee is wiped across the screen, thereby forcing the paste through the openings in the screen, and pressing the paste and screen onto the alumina substrate. The pastes are generally thixotropic in nature (i.e. the viscosity of paste changes when energy is applied to the paste). The squeegee action applies energy to the paste, thereby decreasing its viscosity. As soon as the squeegee passes over the paste, the paste gells and becomes relatively still whereby the paste maintains the pattern of the screen as it is applied to the substrate. Entrance of the paste into through holes in the substrate is assisted by the application of a vacuum, drawing the paste through the holes.

To minimize the problem of copper adhesion to the sidewalls of the laser bored through holes in alumina substrate, a dielectric of alumina filled glass is placed, in accordance with the present invention, into the through holes to seal off the slag. The alumina filled glass dielectric is mechanically and chemically reactive to both the substrate, slag and copper.

The intermediate material such as the glass filled alumina dielectric can be deposited on the sidewalls of the laser bored hole utilizing any conventional printing technique. In one such technique, the intermediate dielectric material is applied directly to a screen which is in turn placed over the substrate. The screen has openings where the through holes are located. A squeegee is wiped across the screen, thereby forcing the material through the openings in the screen and pressing the same onto the substrate. Flow of the dielectric intermediate material into the through holes and along the sidewalls thereof is assisted by the application of a vacuum to the opposite side of the substrate. In some cases it has been found that the dielectric intermediate material must be thinned so that it can be drawn completely through the hole to eliminate any blockage thereof. This is particularly true when the through holes are quite small. If the intermediate material is not drawn completely through, a blockage will be formed, thus preventing the metallizing material from forming an electrical connection between the surfaces of the substrate. Because of the fact that the through hole must still be open after depositing the intermediate material, the through hole should have a diameter greater than about 2 mils (0.002 inches). Preferably, the through hole with which the method of the present invention is utilized should have a diameter greater than about 5 mils.

The method of the present invention can be utilized with many different metallizing materials. With some metallizing materials, such as silver, palladium-silver or gold, use of the present method is not needed because there is sufficient bonding between the metallizing materials and the glassy slag caused by the laser boring. The method has particular application, however, when copper metallizing material is used. The method of the present invention can be used in conjunction with any of the conventional copper pastes which are used to coat through holes in printed circuit board substrates. Some of these copper pastes include a small amount of frit or glass particles embedded therein while others are so-called "fritless" pastes which are 100% copper. Both types of copper pastes have been found to bond well to the intermediate dielectric material. Du Pont copper pastes numbers 9922 9923 and 4425 have been used in connection with the method of the present invention and have been found to be satisfactory. Other copper pastes normally used in the metallization of printed circuit board through holes can also be utilized.

In accordance with the present invention, the copper paste is deposited in the through holes in any conventional manner. In accordance with the preferred method, however, the copper is applied utilizing a printing technique in which the copper paste is applied directly to a screen which is in turn placed over the substrate. Openings in the screen permit the copper paste to be deposited in the area of the through holes and wherever the other circuit pattern is desired. A squeegee is then wiped across the screen to force the paste through the openings and onto the substrate. The application of a vaccum is used to assist drawing the copper paste through the holes to coat the sidewalls thereof. Following deposit of the copper paste on the sidewalls of the through holes, the board is dried and fired. Because each of the above mentioned copper pastes has different characteristics and viscositites, it is often necessary to adjust the viscosity of material by thinning so that the sidewalls of the through hole can be fully coated.

Several tests and studies have been conducted with respect to the present invention. In one study, a plurality of through holes were bored in an alumina substrate using a laser. Some of these holes were slot shaped with a dimension of 0.090 by 0.020 inches while others were circular holes with diameters ranging form 0.003 to 0.038 inches. Some of the through holes were then metallized using prior art techniques in which only a copper paste material was deposited on the sidewall of the holes (standards), while others were metallized with the same copper paste material, but after depositing a dielectric intermediate material in accordance with the present invention. In such study, Du Pont copper pastes numbers 9922, 9923 and 4425 were used as the metallizing material and Du Pont number 4575D dielectric was used as the intermediate dielectric material. Following the printing, drying and firing processes, various tests were conducted with respect to the metallized through holes. These tests included thermal shock tests in which the metallized through holes were subjected to a change of temperature in a liquid environment from −40° C. to 85° C. over a ten second transference time, a thermal cycling and vibration test in which the temperature of the metallized through holes was cycled between various temperatures over a more extended period of time. Various paste adhesion, solder dip tests and solder leach tests were also conducted to evaluate the adhesion between the metallizing copper and the substrate.

The thermal shock test proved severe to the test substrates of both the standards as well as those utilizing the method of the present invention. The thermal cycling test however, showed no noticeable degradation of the copper/substrate bond utilizing the present invention when compared to the standards. The adhesion tests showed significantly improved adhesion when the intermediate dielectric material was used in accordance with the present invention. When the intermediate dielectric was not used and the copper paste was deposited directly to the glassy slag, adhesion was poor and approximately 15% of the holes resulted in failure.

Although the description of the preferred method has been quite specific, it is contemplated that various modification and changes could be made without deviating from the spirit of the present invention. Accordingly, it is intended that the scope of the present invention be dictated by the appended claims rather than by the description of the preferred method.

I claim:

1. A method of metallizing through holes in dielectric substrates with a metallizing material comprising:

forming a through hole in said substrate utilizing laser techniques;

depositing a first layer of material on the sidewall of said through hole to form an adhesive bridge between the sidewall of said through hole and the metallizing material; and depositing a second layer of an electrically conductive metallizing material onto said first layer, said first layer comprising a glass filled dielectric material having a thermal coefficient compatible with said substrate and having properties enabling it to bond to both the sidewall of said through holes and said electrically conductive second layer.

2. The method of claim 1 including a method of metallizing through holes in dielectric alumina substrates.

3. The method of claim 1 wherein said metallizing material is copper.

4. The method of claim 3 wherein said metallizing material is a copper paste.

5. The method of claim 1 wherein the formation of said through hole forms a glassy slag on the sidewall of said through holes.

6. The method of claim 5 wherein said first layer forms an adhesive bridge between said glassy slag and said second layer.

7. A method of copper metallization of laser bored through holes in a dielectric substrate, said method comprising:

depositing a first layer on the sidewall of said through hole, said first layer comprising a glass filled dielectric material having thermal expansion characteristics compatible with said substrate and being capable of bonding to the sidewall of said through hole and the metallizing copper to form an adhesive bridge between the sidewall of said through hole and the metallizing copper; and depositing a layer of the metallizing copper over said first layer so as to form a conductive path between opposing sides of said dielectric substrate.

8. The method of claim 7 wherein said dielectric substrate is an alumina substrate.

9. The method of claim 7 wherein said metallizing copper is a copper paste having glass particles embedded therein.

10. The method of claim 7 wherein said first layer is a dielectric material used for multi-layer and cross over applications on printed circuit boards.

11. A method of copper metallization of laser bored through holes in an alumina dielectric substrate for a printed circuit board comprising:

depositing a glass filled alumina dielectric on the sidewall of said laser bored through hole so as to form an adhesive bridge between the sidewall of said through hole and said metallizing copper.

12. A method of metallizing through holes in dielectric substrates with a metallizing material comprising:

forming a through hole in said substrate utilizing laser techniques;

depositing a first layer of material on the sidewall of said through hole to form an adhesive bridge between the sidewall of said through hole and the metallizing material; and depositing a second layer of an electrically conductive metallizing material onto said first layer, said first layer comprising a glass filled alumina dielectric material having properties enabling it to bond to both the sidewall of said through holes and said electrically conductive second layer.

13. A method of metallizing through holes in dielectric alumina substrates with a metallizing material comprising:

forming a through hole in said substrate utilizing laser techniques;

depositing a first layer of material on the sidewall of said through hole to form an adhesive bridge between the sidewall of said through hole and the metallizing material; and depositing a second layer of an electrically conductive metallizing material onto said first layer, said first layer comprising a glass filled dielectric compatible with said alumina substrate to form a bond therebetween having properties enabling it to bond to both the sidewall of said through holes and said electrically conductive second layer.

14. A method of metallizing through holes in dielectric alumina substrates with a metallizing material comprising:

forming a through hole in said substrate utilizing laser techniques;

depositing a first layer of material on the sidewall of said through hole to form an adhesive bridge between the sidewall of said through hole and the metallizing material; and depositing a second layer of an electrically conductive metallizing material onto said first layer, said first layer comprising a glass filled alumina dielectric having properties enabling it to bond to both the sidewall of said through holes and said electrically conductive second layer and said metallizing material being copper.

15. A method of copper metallization of laser bored through holes in a dielectric substrate, said method comprising:

depositing a first layer on the sidewall of said through hole, said first layer comprising a glass filled alumina dielectric and being capable of bonding to the sidewall of said through hole and the metallizing copper to form an adhesive bridge between the sidewall of said through hole and the metallizing copper; and depositing a layer of the metallizing copper over said first layer so as to form a conductive path between opposing sides of said dielectric substrate.

16. The method of claim 6 wherein the glass in said glass filled dielectric from which said first layer is formed is chemically reactive with the glass in said glassy slag on the sidewall of said through holes.

* * * * *